United States Patent
Koninckx et al.

(10) Patent No.: US 7,291,224 B2
(45) Date of Patent: Nov. 6, 2007

(54) COVERING ASSEMBLY FOR CRUCIBLE USED FOR EVAPORATION OF RAW MATERIALS

(75) Inventors: Jan Koninckx, Mol (BE); Luc Struye, Mortsel (BE); Johan Lamotte, Rotselaar (BE)

(73) Assignee: Agfa-Gevaert, Mortsel (BE)

( * ) Notice: Subject to any disclaimer, the term of this patent is extended or adjusted under 35 U.S.C. 154(b) by 109 days.

(21) Appl. No.: 11/143,265

(22) Filed: Jun. 2, 2005

(65) Prior Publication Data

US 2005/0217567 A1 Oct. 6, 2005

Related U.S. Application Data

(62) Division of application No. 10/885,332, filed on Jul. 6, 2004, now abandoned.

(60) Provisional application No. 60/501,208, filed on Sep. 8, 2003.

(51) Int. Cl.
 *C30B 25/12* (2006.01)
 *C30B 25/14* (2006.01)
(52) U.S. Cl. .......................... 117/84; 392/389; 118/726
(58) Field of Classification Search ................ 118/726; 392/389; 117/84
 See application file for complete search history.

(56) References Cited

U.S. PATENT DOCUMENTS 3,271,562 A    9/1966  Roberts et al. .............. 392/388
4,061,800 A   12/1977  Anderson .................... 427/568
5,041,719 A    8/1991  Harris et al. ................. 219/390
5,336,324 A    8/1994  Stall et al. ................... 118/719
6,202,591 B1   3/2001  Witzman et al. ...... 118/723 VE
6,237,529 B1   5/2001  Spahn ......................... 118/726
2003/0150377 A1 8/2003  Arimoto et al. .............. 117/84

FOREIGN PATENT DOCUMENTS

EP        1113458      *  7/2001
JP        04-154693       5/1992
JP        05-139882       6/1993
WO        WO 01-03156  *  1/2001

OTHER PUBLICATIONS

EP 03 10 2004 European Search Report, Dec. 9, 2003, Joffreau.

* cited by examiner

*Primary Examiner*—Felisa Hiteshew
(74) *Attorney, Agent, or Firm*—Joseph T. Guy; Nexsen Pruet, LLC

(57) ABSTRACT

The present invention provides an assembly comprising two plates or covers, one of which being an outermost plate or cover, and both, at least in part having a perforation pattern over a surface area covering an open side of a crucible having a bottom and surrounding side walls containing raw materials, wherein said outermost cover is mounted at a distance farther from the said crucible than said cover covering said open side of a crucible, and wherein both covers are mounted versus each other, so that, when viewed through an axis in a direction perpendicular to the bottom of the crucible from a distance to said outermost cover of at least 10 times the distance between said two plates or covers, its contents cannot be observed as their perforations and the crucible are never forming one line, perpendicular to the plane formed by said bottom.

17 Claims, No Drawings

COVERING ASSEMBLY FOR CRUCIBLE USED FOR EVAPORATION OF RAW MATERIALS

CROSS-REFERENCE TO RELATED APPLICATION

This application is a divisional application of U.S. patent application Ser. No. 10/885,332 filed Jul. 6, 2004, now abandoned, which claims priority to U.S. Provisional Application No. 60/501,208 filed Sep. 8, 2003.

FIELD OF THE INVENTION

The present invention relates to a solution for inhomogeneous deposit of phosphor or scintillator material from raw materials, thereby avoiding "spot errors" or "pits", resulting in uneven deposit of said phosphors or scintillators, due to spitting of liquefied raw materials present in heated crucibles).

BACKGROUND OF THE INVENTION

In physical vapor deposition (PVD) as well as in chemical vapor deposition (CVD) techniques, factors providing deposition of homogeneous phosphor or scintillator coating compositions and homogeneous layer thicknesses over the entire surface thereof, besides use of especially designed electrically heated crucible(s) are related with the distance determining the profile of the vapor cloud at the position of the substrate, as has e.g. been described in EP-Applications Nos. 03 100 723, filed Mar. 20, 2003 and 04 101 138, filed Mar. 19, 2004.

Average values of shortest distances between crucible(s) and substrate are preferably in the range of from 5 to 10 cm. Too large distances would lead to loss of material and decreased yield of the process, whereas too small distances would lead to too high a temperature of the substrate.

Care should however be taken in order to avoid "spot errors" or "pits", resulting in uneven deposit of phosphors or scintillators, due to spitting of the liquefied raw materials present in the heated container(s): besides physical presence of an undesired unevenness at the surface, differences in speed or sensitivity may lay burden on its use as a screen, plate or panel for use in diagnostic imaging, especially when those phosphors are suitable for use in direct radiography as scintillators, in intensifying screens as prompt emitting phosphors or in storage panels as stimulable phosphors, used in computed radiography (CR).

OBJECTS AND SUMMARY OF THE INVENTION

Therefore it is an object of the present invention to provide a tool in order to prevent undesired "spots" or "pits" from reaching the substrate or support for phosphors or scintillators to be prepared, while applying CVD or PVD techniques, especially in vacuum conditions in a vacuum chamber, in order to vaporize and deposit said scintillator or phosphor materials on substrates.

The above-mentioned advantageous effects are realized by making use of a particular assembly of covers in combination with heated crucibles containing raw materials as starting materials, wherein said assembly has the specific features set out in claim 1. Specific features for preferred embodiments of the invention are set out in the dependent claims.

Further advantages and embodiments of the present invention will become apparent from the following description.

DETAILED DESCRIPTION OF THE INVENTION

One way to avoid spots to reach the web, substrate or support is to provide the container(s), tray(s), boat(s) or crucible(s) with a metallic raster, supported by the surrounding edges of said crucible(s) and covering, at least in part, said crucible(s).

It is clear that material compositions of cover as well as of the crucibles should be resistant to physical influences, in that the materials should be refractory materials. Desired refractory materials are chosen therefore and are selected from the group of materials consisting of Mo, Nb, Ta and W. An ultimate choice of a suitable material for use as a refractory cover material mostly depends on its manutention as the cover should be brought into the desired form (e.g. deformation by folding or bending of plates of the desired thickness in a so-called "nip-zone" or between rollers or other "flattening means" or "bending means") in order to be suitable for use as a cover onto a container, boat or crucible of raw materials to be vaporized.

It is moreover clear that only the raw material(s) contained in the crucibles or boats should melt at the designed high process temperatures (in the order of at least 300° C., and more preferably at least 450° C. and even in the range up to 700-900° C.) in order to be vaporized and deposited afterwards onto a cooled substrate support. Formation of e.g. "mixed melt" crystals of crucible material and raw materials contained in the crucibles should clearly not be appreciated, as presence of crucible material in deposited layers would be a source of undesired contamination. Besides being physically inert, it is clear that the cover material as well as the crucible material should be chemically inert, in that chemical reactions between contacting raw materials and crucible materials should be impossible, as otherwise the composition of the deposition product onto the cooled substrate would not be under controll. Besides such an uncontrollable composition, homogeneity or uniformity of the deposited layers should be out of controll.

Different configurations are available in order to get the most advantageous solution in order to avoid those spot defects. Even when very small holes are present in a panel, covering the crucible according to the present invention, "spot errors" or "pits" may still disturb the uniformity of the pattern of the deposited layer. A solution therefor is attained by mounting a second cover having small holes (whether or not having an identical hole pattern over its surface) at a distance farther from the crucible than the first cover, wherein, after having mounted both covers having hole patterns at both surfaces, both covers are located so that the holes will never overlap each other completely when viewed from a direction perpendicular to the bottom of the crucible from a distance of at least 10 times the distance between the two outermost plates or covers.

An assembly according to the present invention thus comprises two plates or covers, wherein one of which is an outermost plate or cover, and both, at least in part have a perforation pattern over a surface area covering an open side of a crucible having a bottom and surrounding side walls containing raw materials, wherein said outermost cover is mounted at a distance farther from the said crucible than said cover covering said open side of a crucible, and wherein both covers are mounted versus each other, so that, when viewed through an axis in a direction perpendicular to the bottom of the crucible from a distance to said outermost cover of at least 10 times the distance between said two plates or covers, its contents cannot be observed. Expressed in other words: their perforations or perforation patterns, without exclusion however of weaved refractory metallic structures appearing as perforation patterns, and the bottom of the crucible are never forming one line when viewed from a direction perpendicular to the plane formed by the bottom of the crucible. The raw materials in the crucibles thus remain invisible, when viewed, from a distance from the outermost perforated cover, of at least 10 times the distance between the two plates or covers.

In another preferred embodiment of the present invention, both covers are located versus each other, so that, when viewed in a direction under a restricted viewing angle around each axis perpendicular to the bottom of the crucible, its contents cannot be observed, when said viewing angle is within a range from 5° up to 30°, again when viewed from a distance (from the outermost perforated plate or cover) of at least 10 times the distance between the two outermost plates or covers.

According to the present invention an assembly is provided, wherein said two plates or covers are mounted parallel.

In one embodiment according to the present invention, a perforation pattern in plates or covers has perforations having average equivalent circular diameters in the range of 1 mm up to 5 mm, and an average a distance between centers of equivalent circles in the range from 2 mm up to 10 mm. The terms "equivalent circular diameters" and "equivalent circles" have been introduced in order to to allow each form of perforation and to define the dimensions of the perforations and distances between perforations in a way, independent on the form of those perforations or perforation patterns: so the term "equivalent circular diameter" refers to a surface of whatever a perforation, expressed as its equivalent surface of a circle, from which the diameter is calculated. From the same equivalent circular surfaces, the centres taken in order to express average distances between perforations. Forms of perforations or perforation patterns, even when obtained from or in a weaved structure may circles, triangles, squares, hexagons (e.g. in form of honeycombs), or another polygon, without however being limited thereto and may be identical in size or not. So e.g. perforations having a larger size in the centre of the outermost plate and smaller sizes in the vicinity of the side walls and e.g. vice versa for the plate in closest contact with the crucible may be advantageous in the configuration of the assembly of the present invention. According to the present invention shortest distances between perforated plates or covers in the assembly are in the range of 1 mm up to 20 mm, and more preferably in the range of 5 mm up to 10 mm.

In one embodiment according to the present invention, the assembly is constructed so that said perforations are identical for both of said two plates.

In another embodiment according to the present invention, the assembly is constructed so that said perforations are differing for both of the two plates, in that the plate farther from the crucible has the smallest perforations.

In still another embodiment for the assembly according to the present invention it is preferred that perforations have a larger size in the centre of the outermost plate and smaller sizes in the vicinity of the side walls of the crucible and vice versa for the perforated plate in closest contact with the crucible.

In a further embodiment according to the present invention in said assembly said two covers and said crucible are made from same or differing refractory materials, wherein said refractory materials are metal or metal alloys selected from the group consisting of tantalum (Ta), molybdene (Mo), niobium (Nb), tungsten (W) and heat-resistant stainless steel. Said refractory materials are thus the same or differing refractory materials as for the crucible whereupon the plates or covers are mounted in the assembly according to the present invention.

A cover without holes or any other perforation pattern, also called "non-perforated cover" as a closing cover or "slot cover" is preferably present as an outermost cover of the assembly according to the present invention, more particularly while heating, thereby covering the holes of the outermost cover of the cover assembly according to the present invention. The assembly according to the present invention is thus further provided with a non-perforated cover as a closing cover. Before having been brought the crucible to an optimized and constant high temperature, wherein said temperature is preferably homogeneously distributed over the whole crucible in order to evaporate the raw materials in a "steady-state-flow", it is indeed preferred to cover the crucible with such a slot cover.

Once the "slot cover" is removed, evaporation of the raw materials thus proceeds in a way in order to get a continuous and homogeneous vapor stream in the direction to the substrate, wherein a guiding plate is further provided within an evaporation or deposition chamber, thereby guiding one or more vapor stream(s) towards the substrate in order to more sharply define the region wherein phosphor or scintillator material should become deposited. So presence of a baffle advantageously restricts the vapor deposition region on the substrate to a small segment or sector, in order to prevent undesired deposition of scintillator or phosphor material as e.g. on the wall of the deposition chamber.

Especially in vacuum deposition processes, vaporized raw materials may escape from the liquefied or molten raw material is mixture in an uncontrolled way, at a rate in the range from several m/s, and even km/s.

Preferred phosphors of the alkali metal storage type to be deposited from the vapor phase, making use of an assembly as described hereinbefore are e.g. those that have been described in U.S. Pat. No. 5,736,069.

That phosphor has been disclosed as having the general formula given hereinafter:

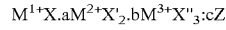

wherein:

$M^{1+}$ is at least one member selected from the group consisting of Li, Na, K, Cs and Rb, $M^{2+}$ is at least one member selected from the group consisting of Be, Mg, Ca, Sr, Ba, Zn, Cd, Cu, Pb and Ni, $M^{3+}$ is at least one member selected from the group consisting of Sc, Y, La, Ce, Pr, Nd, Pm, Sm, Eu, Gd, Tb, Dy, Ho, Er, Tm, Yb, Lu, Al, Bi, In and Ga, Z is at least one member selected from the group $Ga^{1+}$, $Ge^{2+}$, $Sn^{2+}$, $Sb^{3+}$ and $As^{3+}$, X, X' and X" may be the same or different and each represents a halogen atom selected from the group consisting of F, Br, Cl, and I, and $0 \leq a \leq 1$, $0 \leq b \leq 1$ and $0 < c \leq 0.2$.

Besides screens or panels the phosphor or scintillator layers of which have a composition as disclosed hereinbefore a phosphor screen or panel containing a CsX:Eu stimulable phosphor, wherein X represents a halide selected from the group consisting of Br, Cl and I is highly desired.

Preparation steps in order to manufacture such screens or panels have been described in WO 01/03156. In favor of image sharpness needle shaped Eu-activated alkali metal halide phosphors, and more particularly, Eu-activated CsBr phosphor screens as described in EP-A 1 113 458 are preferred and, in view of an improved sensitivity, annealing of said phosphors as in EP-A 1 217 633 is advantageously performed, said annealing step consisting of bringing the cooled deposited mixture as deposited on the substrate to a temperature between 80 and 220° C. and maintaining it at that temperature for between 10 minutes and 15 hours.

The high degree of crystallinity is easily analysed by X-ray diffraction techniques, providing a particular XRD-spectrum as has been illustrated in EP-A 1 113 458. Therefore a mixture of CsBr and EuOBr and/or $EuBr_3$ is provided as a raw material mixture in the crucibles, wherein a ratio between both raw materials normally is about 90% by weight. The high degree of crystallinity is easily analysed by X-ray diffraction techniques, providing a particular XRD-spectrum as has been illustrated in EP-A 1 113 458.

Therefore a mixture of CsBr and EuOBr and/or $EuBr_3$ is provided as a raw material mixture in the crucibles, wherein a ratio between both raw materials normally is about 90% by weight of the cheap CsBr and 10% of the expensive EuOBr, both expressed as weight %.

It has however been shown that as a function of coating (evaporating) temperature ratios can be adapted in favor of lower material and production cost, without resulting in changes in composition: so higher vaporization temperatures for the raw material mixture in ratio amounts of 99.5 wt % CsBr and 0.5 wt % EuOBr/$EuBr_3$ provide the same result (related with speed) as before.

Such a process obviously leads to a more homogeneously divided phosphor layer and a lower amount of Eu-dopant.

Screens of CsBr: $Eu^{2+}$ phosphors having lower amounts of Europium dopant, i.a. in the range from 100-200 p.p.m. versus at least 500-800 p.p.m. (see Examples in EP-A 1 113 458—phosphor layers prepared therein in the absence however of the covered crucible assembly according to the present invention), have thus become available.

These data are suggesting that the presence of lower amounts of Europium dopant, nevertheless leading to the same screen speed, is indicative for a more homogeneous distribution and/or more efficient built-in of the dopant.

Opposite thereto screens requiring an amount of dopant in the range from 1000 p.p.m., and even up to 3000 p.p.m., are indicating that dopants do not seem to have been built in efficiently.

From the examples in EP-A 1 113 458 CsBr:Eu it has been learnt that screens were made via thermal vapor deposition of CsBr and EuOBr (and/or $EuBr_3$) and that variables in the deposition process were the substrate temperature and the Ar gas pressure, leading to needle-shaped crystals having characteristic high intensity for the [100] crystal plane in XRD-spectra thereof.

EXAMPLE

Making use of an assembly according to the present invention not only avoids "spitting" or formation of undesired spots as envisaged in the objects of the present invention, but also leads to more homogeneous distribution of the dopant (as for the needle-shaped CsBr:$Eu^{2+}$ phosphor, eventually comprising trivalent Eu-dopant in minor, neglectable amounts).

In the assembly of the present invention it was experimentally observed that when heating the crucible to an optimized and constant high temperature (800° C.), while covering the assembly with a non-perforated outermost cover, in order to get said temperature homogeneously distributed over the whole crucible in order to further evaporate the raw materials (CsBr and EuOBr/$EuBr_3$ in respective amounts in wt % of 95:5) in a "steady-state-flow" in a homogenous vapor cloud after removal of the said outermost non-perforated cover, that on the perforated cover farther from the crucible, during evaporation, needles were formed as an intermediate "layer" onto said perforated cover (mounted at a distance of 5 mm from the cover in contact with the walls of the crucible).

Perforations of the covers were in form of circles having a diameter of 2 mm at a distance of the centres of 10 mm. The said intermediate layer was continuously fed from the evaporating raw materials present in the crucible on one side, and continuously depleted due to evaporation into the vacuum chamber at the other side, wherein the evaporation cloud was deposited onto an aluminum substrate, just as described in EP-Applications Nos 03 100 723, filed Mar. 20, 2003 and 04 101 138, filed Mar. 19, 2004.

This phenomenon wherein such an intermediate layer was formed was understood as forming of an intermediate "homogenising layer", providing a much more homogeneous incorporation of europium dopant in the cesium bromide base material, thereby providing ability to make use of less expensive europium dopant raw material during preparation.

Besides making use of an improved assembly according to the present invention with two parallel plates covering the said crucible, wherein said plates were perforated and mounted onto said crucible in order to avoid "spitting" or "sputtering" of liquefied raw material after heating, use was made of a crucible having a bottom and surrounding side walls provided with electrode clamps at exterior sites of side walls located opposite with respect to each other, wherein said sites were extending as lips at said side walls, and wherein said clamps were connectable with electrodes for heating said crucible, characterized in that a cross-section of each of said lips between between crucible wall and electrode clamp was reduced with at least 5% as disclosed in the patent application, filed on the same day as the present patent application, thereby providing ability to more homogeneously heat the crucible in the vacuum deposition chamber.

Although the present invention has been described in connection with preferred embodiments thereof, it will be understood that it is not intended to limit the invention to those embodiments, as it is apparent to those skilled in the art that numerous modifications can be made without departing from the scope of the invention as defined in the appending claims.

The invention claimed is:

1. A method for forming a phosphor screen comprising:
    placing a substrate in an assembly comprising two plates wherein one plate of said plates is an outermost plate, and both, at least in part having a perforation pattern over a surface area covering an open side of a crucible having a bottom and surrounding side walls containing raw materials, wherein said outermost plate is mounted at a distance farther from said crucible than said cover covering said open side of said crucible, and wherein both plates are mounted versus each other, so that, when viewed through an axis in a direction perpendicular to the bottom of the crucible from a distance to said outermost plate of at least 10 times the distance between said two plates, its contents cannot be observed;

heating said crucible to evaporate said raw material; and depositing said evaporated raw material on said substrate further provided with a non-perforated cover as a closing cover.

2. The method for forming a phosphor screen of claim 1 wherein both plates are mounted versus each other, so that, when viewed in a direction under a restricted viewing angle around each axis perpendicular to the bottom of the crucible, from a distance to said outermost cover of at least 10 times the distance between said two plates or covers, its contents cannot be observed.

3. The method for forming a phosphor screen of claim 2, wherein said viewing angle is within a range from 5° up to 30°.

4. The method for forming a phosphor screen of claim 1, wherein said plates are mounted parallel.

5. The method for forming a phosphor screen of claim 1, wherein perforations in plates have equivalent circular diameters in the range of 1 mm up to 5 mm, and an average a distance between centers of the said holes is in the range from 2 mm up to 10 mm.

6. The method for forming a phosphor screen of claim 1, wherein a shortest distances between plates or covers is in the range of from 1 mm up to 20 mm.

7. The method for forming a phosphor screen of claim 1, wherein a shortest distances between plates is in the range of from 5 mm up to 10 mm.

8. The method for forming a phosphor screen of claim 1, wherein said perforations are identical for both of said two plates.

9. The method for forming a phosphor screen of claim 1, wherein said perforations are differing for both of the two plates, in that the plate farther from the crucible has smaller perforations.

10. The method for forming a phosphor screen of claim 1, wherein said two plates, said non-perforated closing cover and said crucible are made from same or differing refractory materials, and wherein said refractory materials are metal or metal alloys selected from the group consisting of tantalum (Ta), molybdene (Mo), niobium (Nb), tungsten (W) and heat-resistant stainless steel.

11. The method for forming a phosphor screen of claim 1 wherein said raw material comprises CsBr and EuOBr/EuBr$_3$.

12. The method for forming a phosphor screen of claim 11 wherein said CsBr and EuOBr/EuBr$_3$ are in a ratio of 95:5.

13. The method for forming a phosphor screen of claim 1 wherein said deposited raw material comprises CsBr:Eu$^{2+}$.

14. The method for forming a phosphor screen of claim 13 wherein said CsBr:Eu$^{2+}$ comprises 100-200 ppm europium.

15. A method for forming a phosphor screen comprising:

placing a substrate in an assembly comprising two plates wherein one plate of said plates is an outermost plate, and both, at least in part having a perforation pattern over a surface area covering an open side of a crucible having a bottom and surrounding side walls containing raw materials comprising CsBr and EuOBr/EuBr$_3$, wherein said outermost plate is mounted at a distance farther from the said crucible than said cover covering said open side of a crucible, and wherein both plates are mounted versus each other, so that, when viewed through an axis in a direction perpendicular to the bottom of the crucible from a distance to said outermost plate of at least 10 times the distance between said two plates, its contents cannot be observed;

heating said crucible to evaporate said raw material; and depositing CsBr:Eu$^{2+}$ on said substrate.

16. The method for forming a phosphor screen of claim 15 wherein said CsBr and EuOBr/EuBr$_3$ are in a ratio of 95:5.

17. The method for forming a phosphor screen of claim 15 wherein said CsBr:Eu$^{2+}$ comprises 100-200 ppm europium.

* * * * *